(12) United States Patent
Ho et al.

(10) Patent No.: US 7,054,117 B2
(45) Date of Patent: May 30, 2006

(54) METHOD OF MAKING A READ HEAD HAVING A TUNNEL JUNCTION SENSOR WITH A FREE LAYER BIASED BY EXCHANGE COUPLING WITH INSULATING ANTIFERROMAGNETIC (AFM) LAYERS

(75) Inventors: Kuok San Ho, Cupertino, CA (US); Tao Pan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/826,945

(22) Filed: Apr. 17, 2004

(65) Prior Publication Data

US 2004/0196596 A1    Oct. 7, 2004

Related U.S. Application Data

(62) Division of application No. 10/054,656, filed on Jan. 18, 2002, now Pat. No. 6,754,056.

(51) Int. Cl.
*G11B 5/127* (2006.01)
*G11B 5/39* (2006.01)
*H04R 31/00* (2006.01)

(52) U.S. Cl. .............................. 360/324.12; 29/603.14

(58) Field of Classification Search ............ 360/324.2, 360/317, 324.12, 324.11; 29/603.14, 603.13, 29/603.07, 603.12
See application file for complete search history.

(56) References Cited

U.S. PATENT DOCUMENTS

| | | | | |
|---|---|---|---|---|
| 6,636,396 B1* | 10/2003 | Gill | ....................... | 360/324.12 |
| 6,704,176 B1* | 3/2004 | Shukh et al. | .......... | 360/324.12 |
| 6,751,845 B1* | 6/2004 | Gill | ........................ | 29/603.14 |
| 6,754,056 B1* | 6/2004 | Ho et al. | .................. | 360/324.2 |
| 6,833,982 B1* | 12/2004 | Jayasekara | ............... | 360/324.2 |
| 6,865,062 B1* | 3/2005 | Pinarbasi | ............... | 360/324.11 |
| 2001/0005300 A1* | 6/2001 | Hayashi | ..................... | 360/317 |

* cited by examiner

*Primary Examiner*—William J Klimowicz
(74) *Attorney, Agent, or Firm*—Ervin F. Johnston

(57) ABSTRACT

Longitudinal biasing of a free layer in a current perpendicular to the planes of the layers (CPP) type of sensor in a read head is implemented by pinning magnetic moments of first and second side portions of the free layer beyond the track width of the read head with first and second insulating antiferromagnetic (AFM) layers which are exchange coupled thereto. The pinning of the magnetic moments of the first and second side portions of the free layer pin and longitudinally bias the central active portion of the free layer within the track width so that the central portion of the free layer is magnetically stable.

3 Claims, 11 Drawing Sheets

METHOD OF MAKING A READ HEAD HAVING A TUNNEL JUNCTION SENSOR WITH A FREE LAYER BIASED BY EXCHANGE COUPLING WITH INSULATING ANTIFERROMAGNETIC (AFM) LAYERS

This is a divisional application of application Ser. No. 10/054,656 filed Jan. 18, 2002 which is now U.S. Pat. No. 6,754,056.

BACKGROUND OF THE INVENTION

1. Field of the Invention

The present invention relates to a read head having a tunnel junction sensor with a free layer biased by exchange coupling with insulating antiferromagnetic (AFM) layers and, more particularly, to such a read head wherein the free layer is located within a track width of the read head and the insulating AFM layers are located beyond the track width.

2. Description of the Related Art

The heart of a computer is a magnetic disk drive which includes a rotating magnetic disk, a slider that has read and write heads, a suspension arm above the rotating disk and an actuator arm that swings the suspension arm to place the read and write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic field signals from the rotating disk. The read and write heads are connected to processing circuitry that operates according to a computer program to implement the writing and reading functions.

An exemplary high performance read head employs a tunnel junction sensor for sensing the magnetic field signals from the rotating magnetic disk. The sensor includes a nonmagnetic tunneling barrier layer sandwiched between a ferromagnetic pinned layer and a ferromagnetic free layer. An antiferromagnetic pinning layer interfaces the pinned layer for pinning the magnetic moment of the pinned layer 90° to an air bearing surface (ABS) wherein the ABS is an exposed surface of the sensor that faces the rotating disk. The tunnel junction sensor is located between ferromagnetic first and second shield layers. First and second leads, which may be the first and second shield layers, are connected to the tunnel junction sensor for conducting a tunneling current therethrough. The tunneling current is conducted perpendicular to the major film planes (CPP) of the sensor as contrasted to a spin valve sensor where a sense current is conducted parallel to or in the major film planes (CIP) of the spin valve sensor. A magnetic moment of the free layer is free to rotate upwardly and downwardly with respect to the ABS from a quiescent or zero bias point position in response to positive and negative magnetic field signals from the rotating magnetic disk. The quiescent position of the magnetic moment of the free layer, which is parallel to the ABS, is when the tunneling current is conducted through the sensor without magnetic field signals from the rotating magnetic disk. The sensitivity of the tunnel junction sensor is quantified as magnetoresistive coefficient dr/R where dr is the change in resistance of the tunnel junction sensor from minimum resistance to maximum resistance and R is the resistance of the tunnel junction sensor at minimum resistance.

The first and second shield layers or first and second lead layers may engage the bottom and the top respectively of the tunnel junction sensor so that the first and second shield layers and/or first and second lead layers serve as leads for conducting the tunneling current ($I_T$) through the tunnel junction sensor perpendicular to the major planes of the layers of the tunnel junction sensor. The tunnel junction sensor has first and second side surfaces which are normal to the ABS. First and second hard bias layers are slightly separated by first and second insulation layers from the first and second side surfaces respectively of the tunnel junction sensor for longitudinally biasing and magnetically stabilizing the free layer. This longitudinal biasing also maintains the magnetic moment of the free layer parallel to the ABS when the read head is in the quiescent condition.

It should be understood that the hard bias strength of the hard biasing layers is very sensitive to the thickness of the aforementioned first and second insulating layers between the hard bias layers and the side surfaces of the sensor. The first and second insulation layers are usually thick in order to ensure sufficient insulation between the first and second hard bias layers and the sensor. When the insulation is too thick there is insufficient longitudinal field to suppress multidomain activity of the free layer and when too thin the sensor is stiff in its response to field signals. Therefore, an alternative stabilization scheme is proposed without use of insulation between the sensor and the stabilization materials.

SUMMARY OF THE INVENTION

The present invention overcomes the aforementioned problems by longitudinally biasing first and second side portions of the free layer which extend laterally beyond the track width of the sensor. The first and second side portions of the free layer are extensions of the active central portion of the free layer and are exchange coupled to first and second insulating antiferromagnetic (AFM) layers. In a first embodiment of the invention the free layer is at the top of the sensor and first and second side portions of the top free layer are formed on top of insulating first and second antiferromagnetic (AFM) layers so as to be exchange coupled thereto and longitudinally biased thereby. In a second embodiment of the invention the free layer is at the bottom of the sensor and the first and second insulating AFM layers are formed on top of the first and second side portions of the free layer beyond the track width. The present invention also includes a novel method of making each of the first and second embodiments of the invention.

An object of the present invention is to provide alternative longitudinal biasing for a free layer of a tunnel junction sensor which is efficient and uniform along the active portion of the free layer without employing thin insulating layers.

Another object is to provide novel and unique methods of making the aforementioned read head.

Other objects and attendant advantages of the invention will be appreciated upon reading the following description taken together with the accompanying drawings.

DESCRIPTION OF THE PREFERRED EMBODIMENTS

Magnetic Disk Drive

Figure 1:
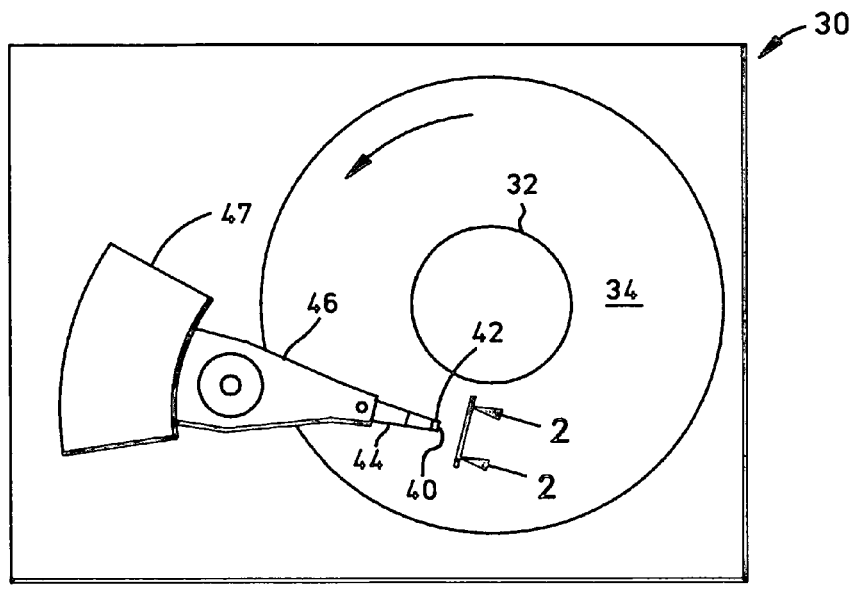
FIG. 1 is a plan view of an exemplary magnetic disk drive.
Figure 2:
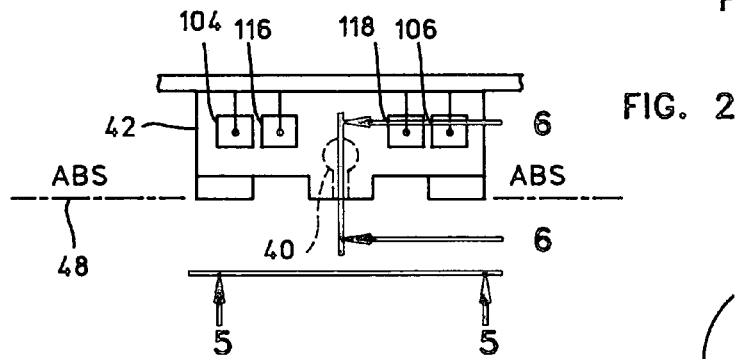
FIG. 2 is an end view of a slider with a magnetic head of the disk drive as seen in plane 2—2 of FIG. 1.
Figure 3:
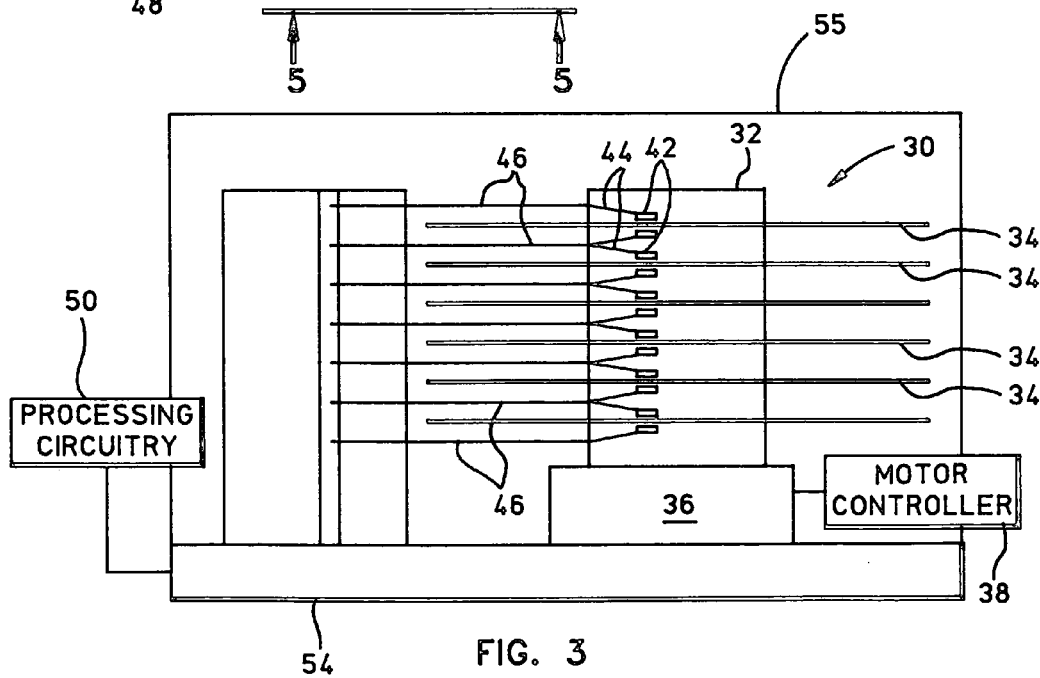
FIG. 3 is an elevation view of the magnetic disk drive wherein multiple disks and magnetic heads are employed.
Figure 4:
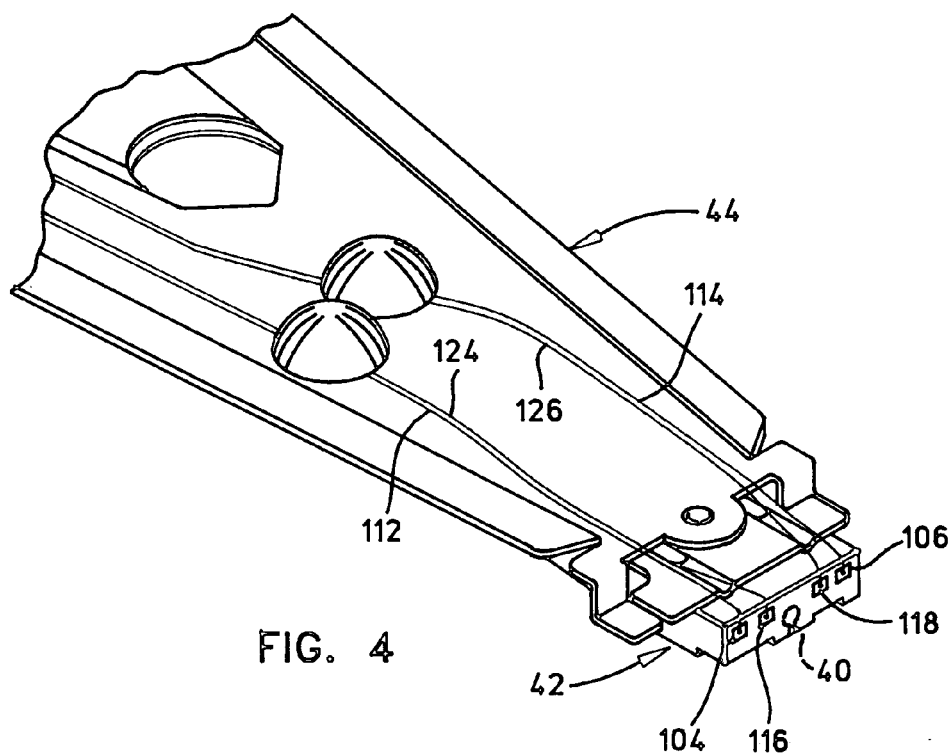
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a spindle motor 36 that is controlled by a motor controller 38. A slider 42 has a combined read and write magnetic head 40 and is supported by a suspension 44 and actuator arm 46 that is rotatably positioned by an actuator 47. A plurality of disks, sliders and suspensions may be employed in a large capacity direct access storage device (DASD) as shown in FIG. 3. The suspension 44 and actuator arm 46 are moved by the actuator 47 to position the slider 42 so that the magnetic head 40 is in a transducing relationship with a surface of the magnetic disk 34. When the disk 34 is rotated by the spindle motor 36 the slider is supported on a thin (typically, 0.05 µm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides spindle motor drive signals for rotating the magnetic disk 34, and provides control signals to the actuator 47 for moving the slider to various tracks. In FIG. 4 the slider 42 is shown mounted to a suspension 44. The components described hereinabove may be mounted on a frame 54 of a housing 55, as shown in FIG. 3.

Figure 5:
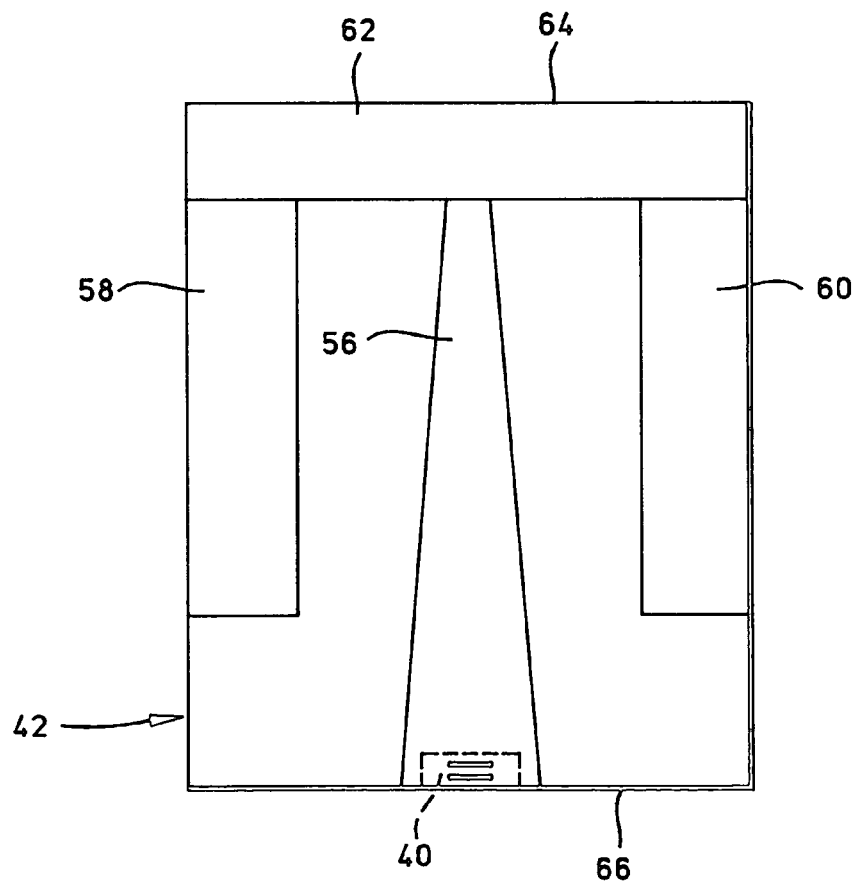
FIG. 5 is an ABS view of the magnetic head taken along plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figure 6:
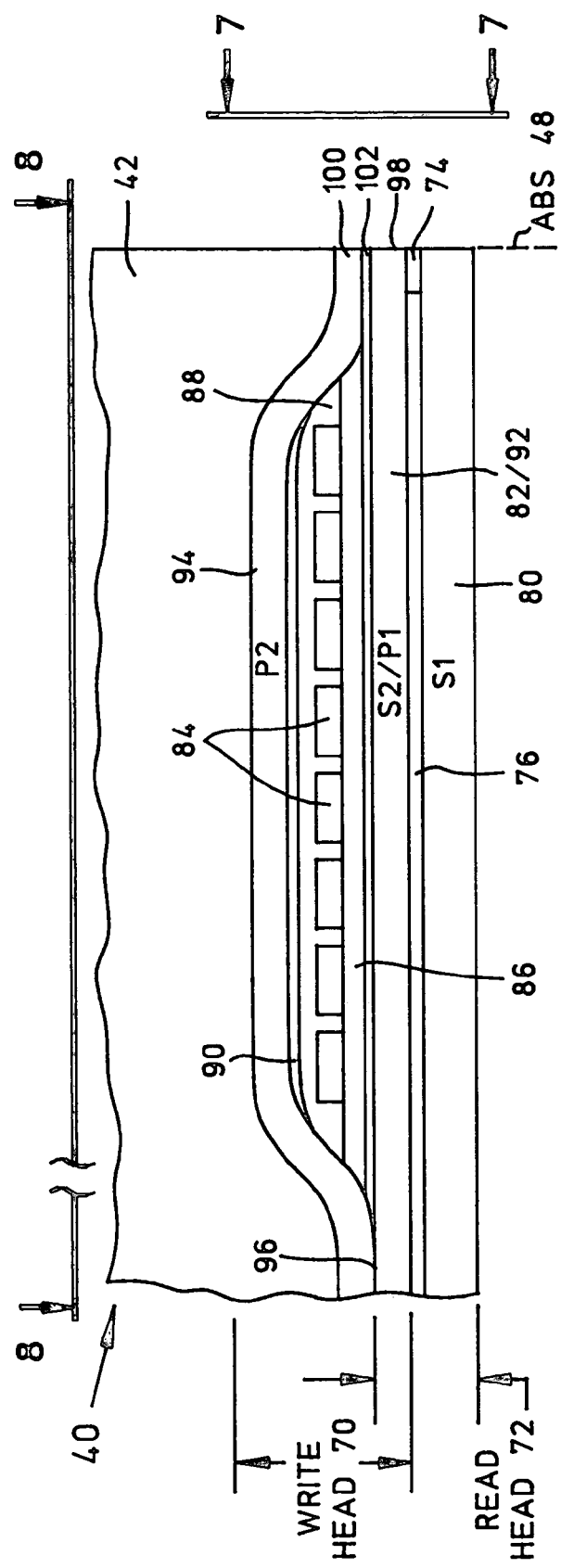
FIG. 6 is a partial view of the slider and a merged magnetic head as seen in plane 6—6 of FIG. 2.
Figure 7:
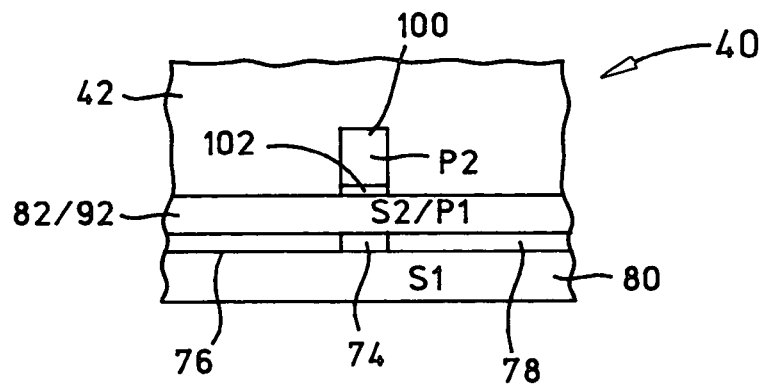
FIG. 7 is a partial ABS view of the slider taken along plane 7—7 of FIG. 6 to show the read and write elements of the merged magnetic head.
Figure 8:
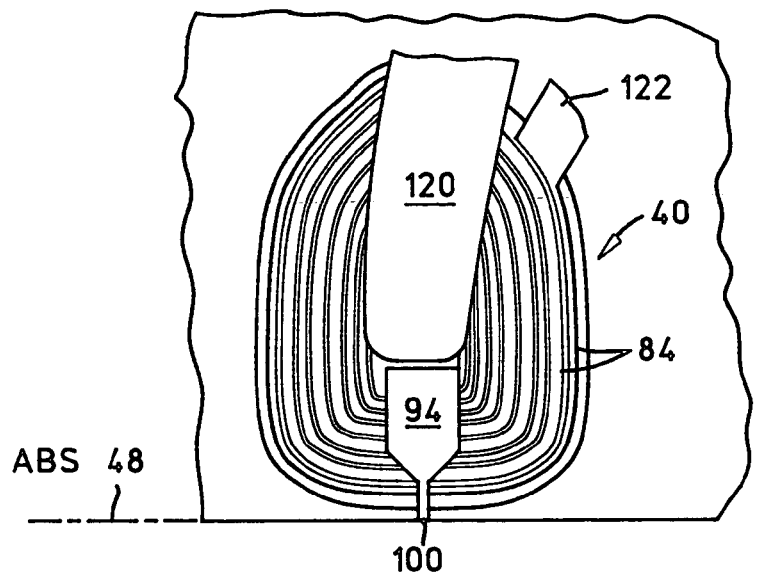
FIG. 8 is a view taken along plane 8—8 of FIG. 6 with all material above the coil layer and leads removed.

FIG. 6 is a side cross-sectional elevation view of a merged magnetic head 40, which includes a write head portion 70 and a read head portion 72, the read head portion employing a tunnel junction sensor 74 of the present invention. FIG. 7 is an ABS view of FIG. 6. The tunnel junction sensor 74 and a nonmagnetic electrically nonconductive insulation layer 76 are sandwiched between ferromagnetic first and second shield layers 80 and 82. In response to external magnetic fields, the resistance of the spin valve sensor 74 changes. A tunneling current ($I_T$) conducted through the sensor causes these resistance changes to be manifested as potential changes. These potential changes are then processed as readback signals by the processing circuitry 50 shown in FIG. 3. The tunneling current ($I_T$) may be conducted through the tunnel junction sensor 74 perpendicular to the planes of its film surfaces by the first and second shield layers 80 and 82 which may serve as first and second leads. Since the first shield layer 82 and the first pole piece layer 92 are a common layer the read and write head assembly in FIG. 6 is referred to in the art as a merged head. In a piggyback head the second shield layer 82 and the first pole piece layer 92 are separate layers which are separated by a nonmagnetic isolation layer.

The write head portion 70 of the magnetic head 40 includes a coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. As shown in FIGS. 2 and 4, first and second solder connections 104 and 106 connect leads from the spin valve sensor 74 to leads 112 and 114 on the suspension 44, and third and fourth solder connections 116 and 118 connect leads 120 and 122 from the coil 84 (see FIG. 10) to leads 124 and 126 on the suspension.

Figure 9:
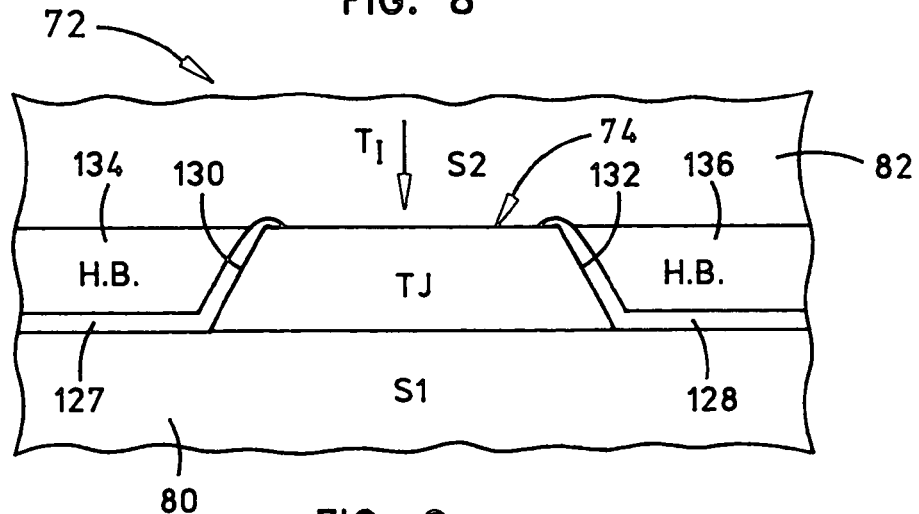
FIG. 9 is an enlarged ABS illustration of a prior art tunnel junction read head.

FIG. 9 is an enlarged ABS illustration of the read head portion shown in FIG. 7. The read head 40 includes the tunnel junction sensor 74. First and second insulation layers 127 and 128, such as alumina ($Al_2O_3$), cover the first shield layer 80 on each side of the tunnel junction sensor 74 as well as slightly covering first and second side walls 130 and 132 of the sensor. First and second hard bias layers 134 and 136 are on the insulation layers 127 and 128 and are adjacent the side walls 130 and 132. The hard bias layers 134 and 136 apply longitudinal field to the sensor 74 for suppression of magnetic domain activity. The sensor 74 and the first and second hard bias layers 134 and 136 are located between ferromagnetic first and second shield layers 80 and 82 which may serve as leads for conducting the tunneling current ($I_T$) through the sensor 74.

The longitudinal biasing strength on the free layer (not shown) of the tunnel junction sensor 74 is highly sensitive to the thickness of the first and second insulation layers 127 and 128. If the thickness of these layers is too thin there is a risk of shorting of the tunneling current ($I_T$) from the tunnel junction sensor 74 to the hard bias layers 134 and 136. If the insulation layers 127 and 128 are too thick then there will be insufficient longitudinal biasing of the free layer in the tunnel junction sensor.

The track width of the read head is typically formed with a bilayer photoresist. After forming sensor material layers a first layer of photoresist is applied by spin coating photoresist on the wafer and then subjecting it to a soft bake to remove casting solvents. Next, a second photoresist layer is spun onto the wafer and soft baked. The first and second photoresist layers are then subjected to a dissolver, which is a basic solution. The dissolver first dissolves the light exposed portions of the second photoresist layer down to the first photoresist layer and then proceeds to dissolve the first photoresist layer causing an undercut below the second photoresist layer. The dissolution is terminated when a desired undercut is obtained with the second photoresist layer overhanging the first photoresist layer on each side of the first photoresist layer. Accordingly, the width of the second photoresist layer defines the track width of the read head and the first photoresist layer permits the first and second photoresist layers to be lifted off with any layers deposited thereon.

The Invention

Figure 10:
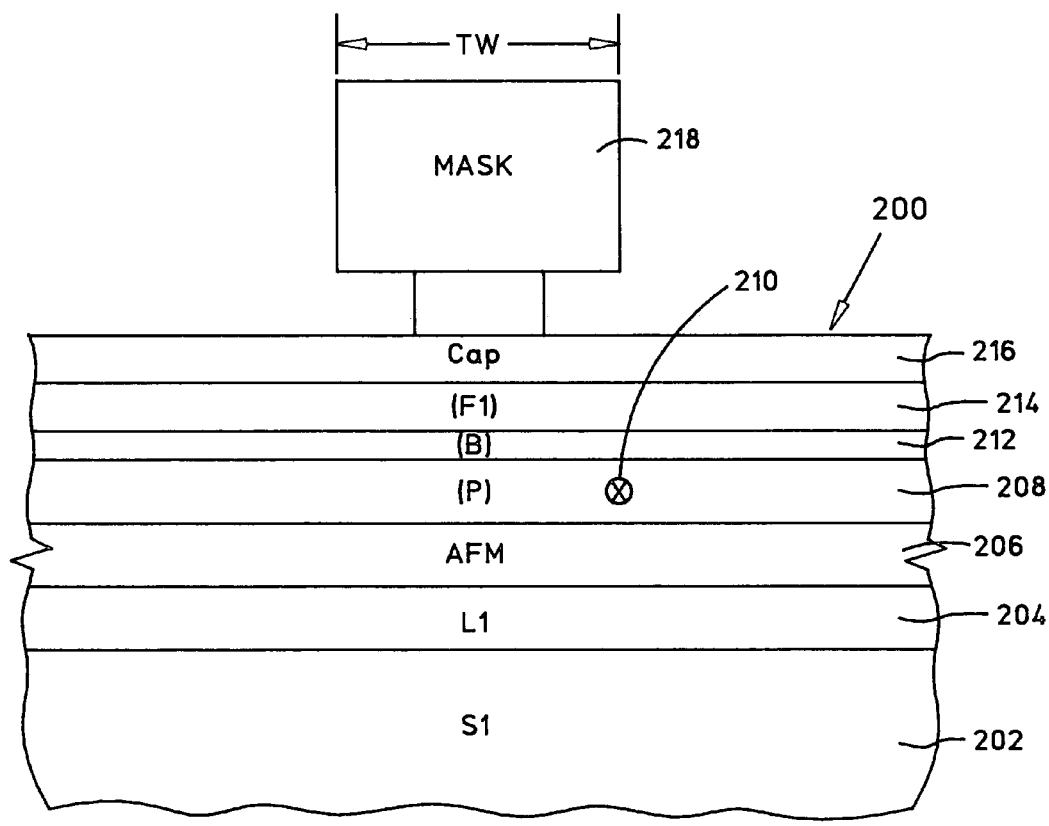
FIG. 10 is a lateral cross-sectional view of sensor material layers with a bilayer photoresist mask thereon.
Figure 11:
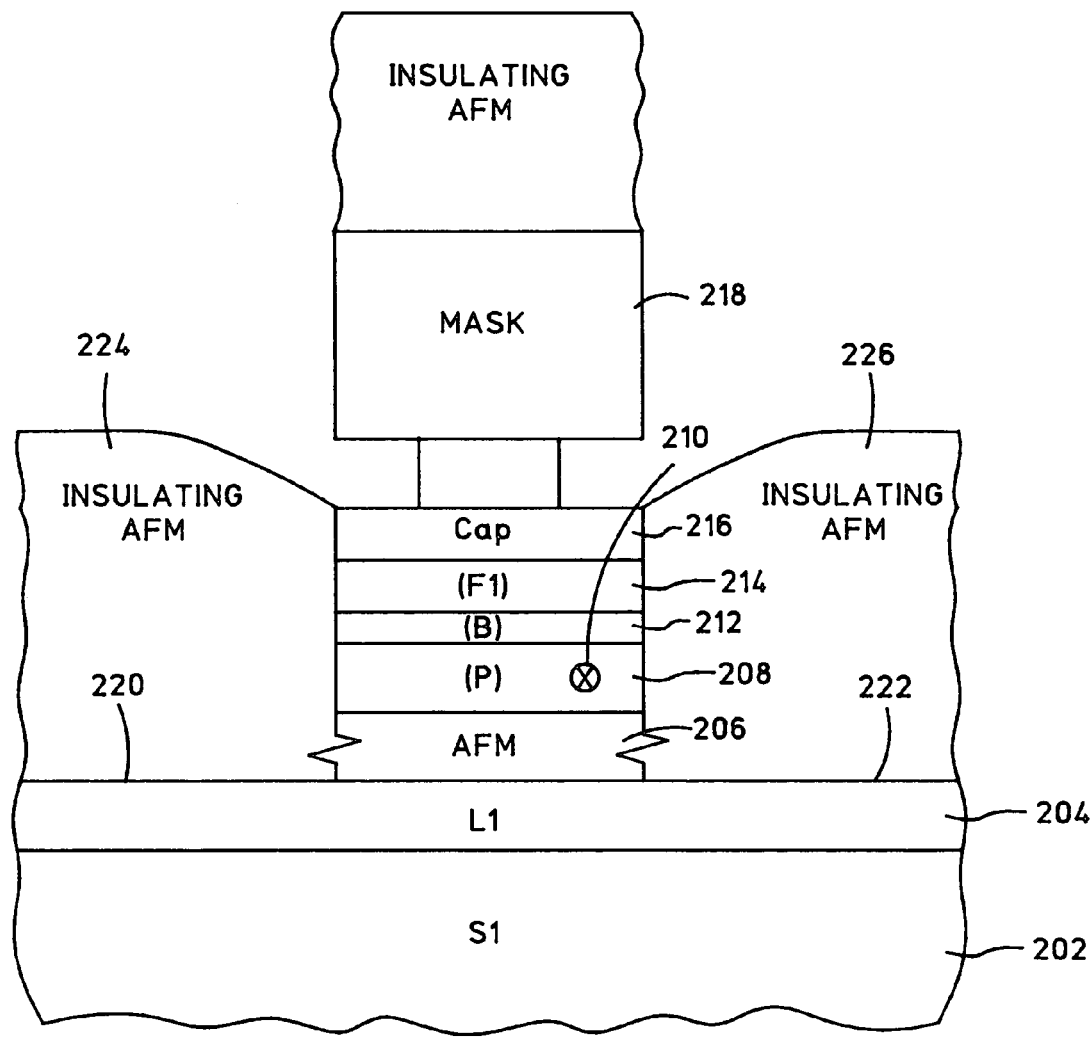
FIG. 11 is the same as FIG. 10 except the sensor material layers have been milled on each side of a track width and then backfilled with an insulating antiferromagnetic (AFM) material.
Figure 12:
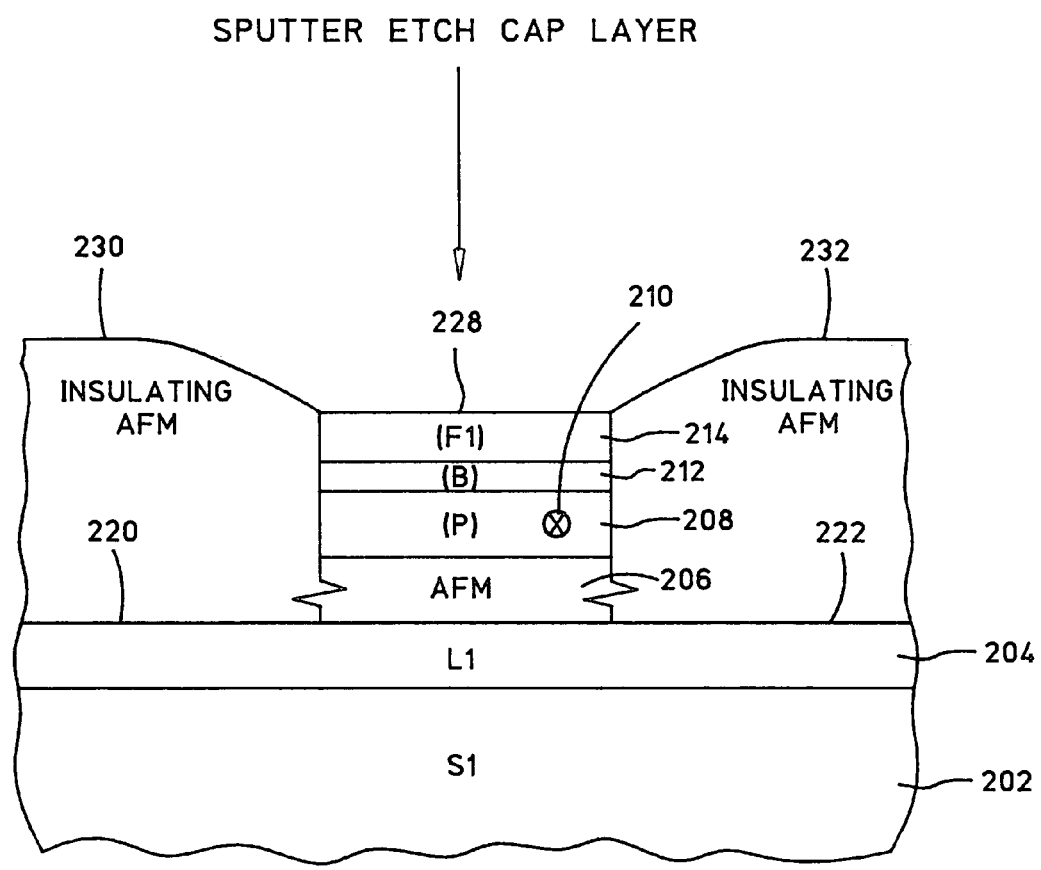
FIG. 12 is the same as FIG. 11 except the bilayer photoresist has been removed and the cap layer has been removed down to the free layer.
Figure 13:
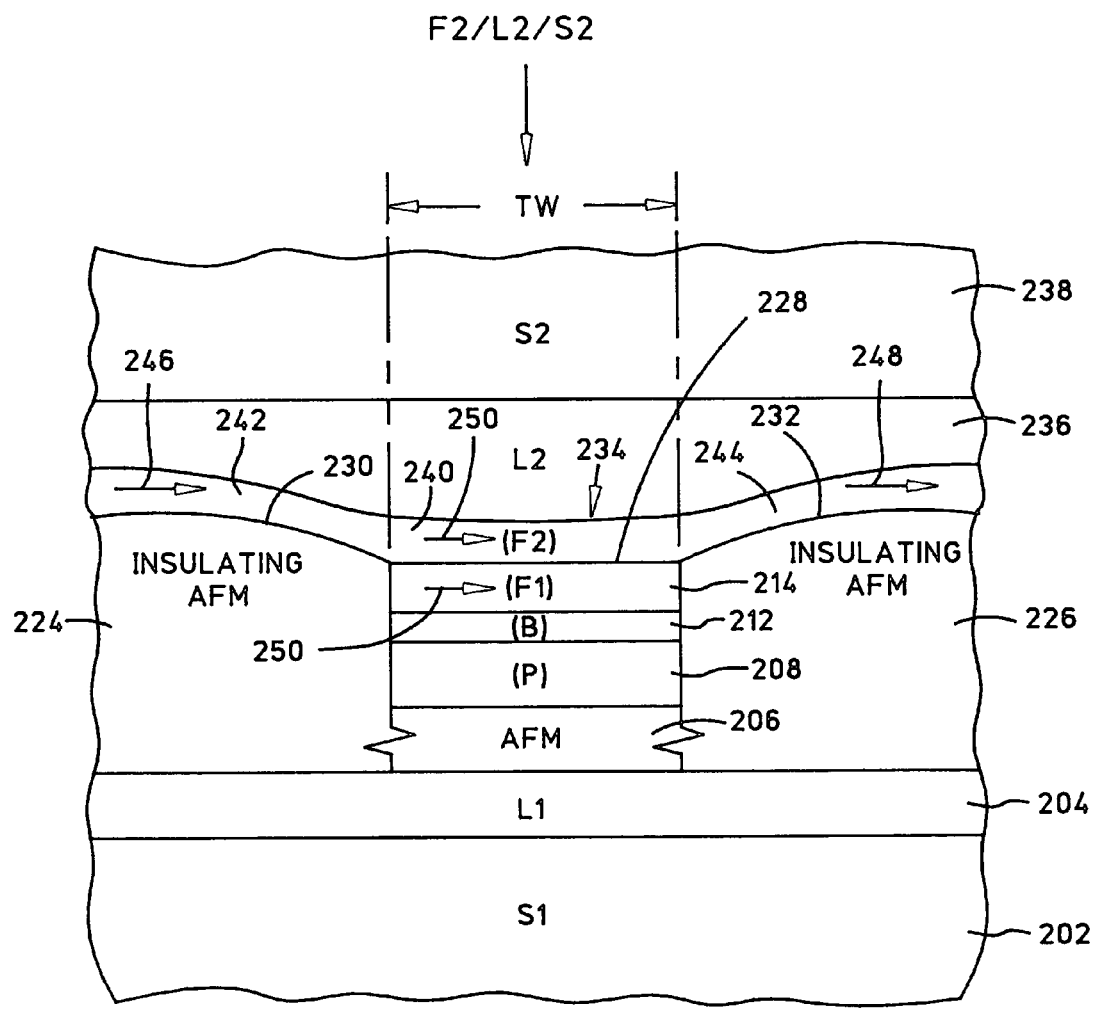
FIG. 13 is the same as FIG. 12 except the second portion of a free layer has been formed on top of a first portion of a free layer and first and second insulating AFM layers and a second lead and a second shield layer have been formed on the second free layer portion.

FIGS. 10–13 illustrate various steps in a first method of making a first embodiment of the present read head which is illustrated in FIG. 13. FIG. 10 is a lateral cross-section view of sensor material layers 200 which are formed on a wafer (not shown). A ferromagnetic first shield layer (S1) 202, which may be the same as the first shield layer 80 in FIGS. 6 and 7, is formed on the wafer, a first lead layer (L1) 204 is formed on the first shield layer, an antiferromagnetic (AFM) pinning layer 206 is formed on the first lead layer, a pinned layer (P) 208 is formed on the pinning layer and is exchange coupled thereto so that a magnetic moment 210 of the pinned layer is pinned perpendicular to the ABS, a nonmagnetic and tunneling barrier layer (B) 212 is formed on the pinned layer, a first portion of a free layer (F1) 214 is formed on the barrier layer and a nonmagnetic cap layer 216 is formed on the first portion of the free layer. On top of the sensor material layers 200 a bilayer photoresist mask 218 is formed which has a width for defining the track width (TW) of the read head.

FIG. 11 is the same as FIG. 10 except ion milling has been implemented to mill through the barrier layer. The milling can be stopped anywhere as long as it passes the barrier layer. An insulating antiferromagnetic (AFM) material has been backfilled to form first and second insulating antiferromagnetic (AFM) layers 224 and 226 which are on top of the first and second lead portions 220 and 222 and are contiguous with first and second side surfaces of the remaining sensor material layers. The preferred insulating AFM material for the layers 224 and 226 is nickel oxide (NiO).

FIG. 12 is the same as FIG. 11 except the mask 218 has been removed and the cap layer 216 has been removed down to the first portion of the free layer (F1) 214 by any suitable means such as sputter etching. This then provides the free layer portion with a top surface 228 and the first and second AFM layers with top surfaces 230 and 232 respectively.

FIG. 13 is the same as FIG. 12 except a second portion of the free layer (F2) 234 is formed on top of the top surface 228 of the first portion of the free layer and on top of the top surface portions 230 and 232 of the first and second insulating AFM layers followed by forming a second lead layer (L2) 236 and a second shield layer (S2) 238 on the second portion (F2) of the free layer 234.

It can be seen that the second portion of the free layer (F2) 234 has a central portion 240 which is magnetically coupled to the first portion of the free layer (F1) 214 in the active track width region and has first and second side portions 242 and 244 which extend from the central portion 240 beyond the track width and are exchange coupled to the first and second insulating AFM layers 224 and 226. Magnetic spins of the first and second insulating AFM layers 224 and 226 are oriented so that magnetic moments 246 and 248 of the first and second side portions of the second free layer (F2) are oriented from right to left or from left to right, as shown in FIG. 13, parallel to the ABS and parallel to the major thin film surfaces of the layers. This causes magnetic moments 250 of the first and second free layers (F1) and (F2) 214 and 240 to be oriented in the same manner for longitudinally biasing the free layers 214 and 240 so that they are uniformly longitudinally biased across the track width of the read head. The read head in FIG. 13 may be employed as the read head 72 shown in FIG. 6.

Figure 14:
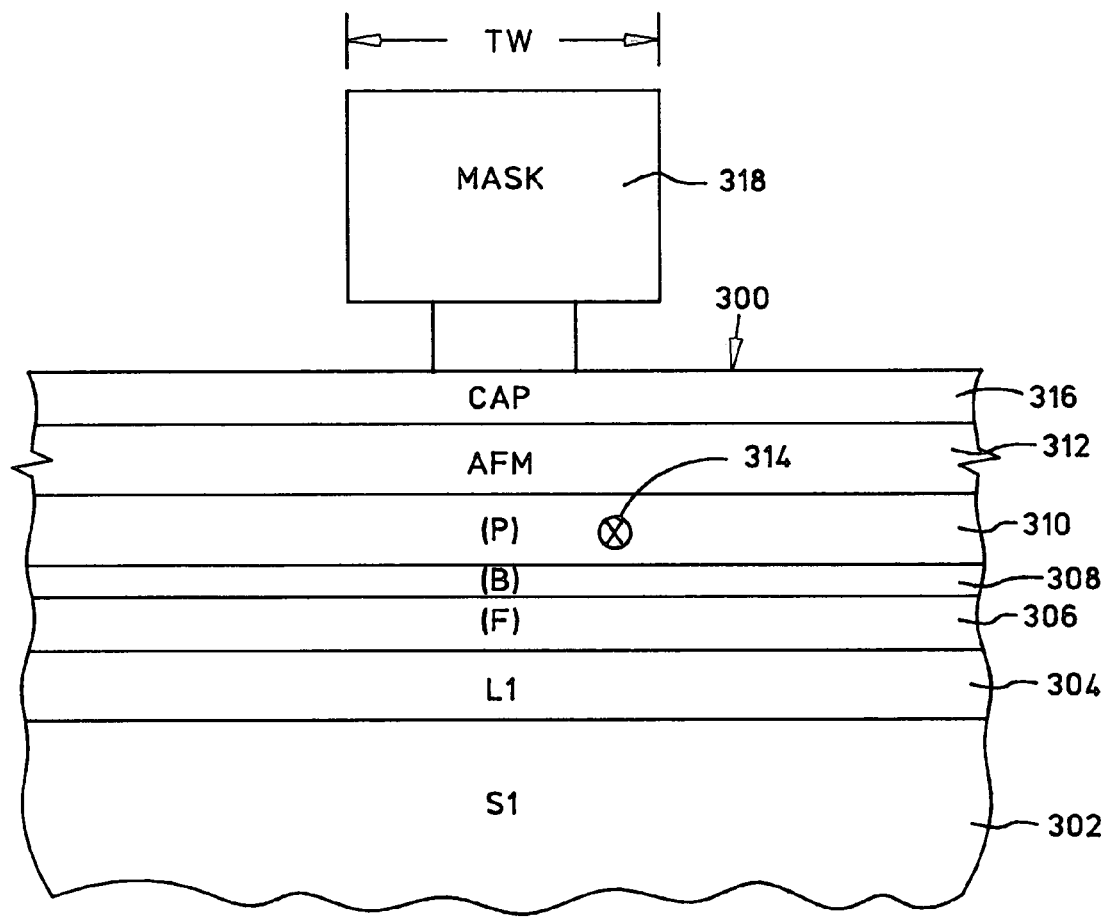
FIG. 14 is another lateral cross-section of sensor material layers with a bilayer photoresist mask thereon.
Figure 15:
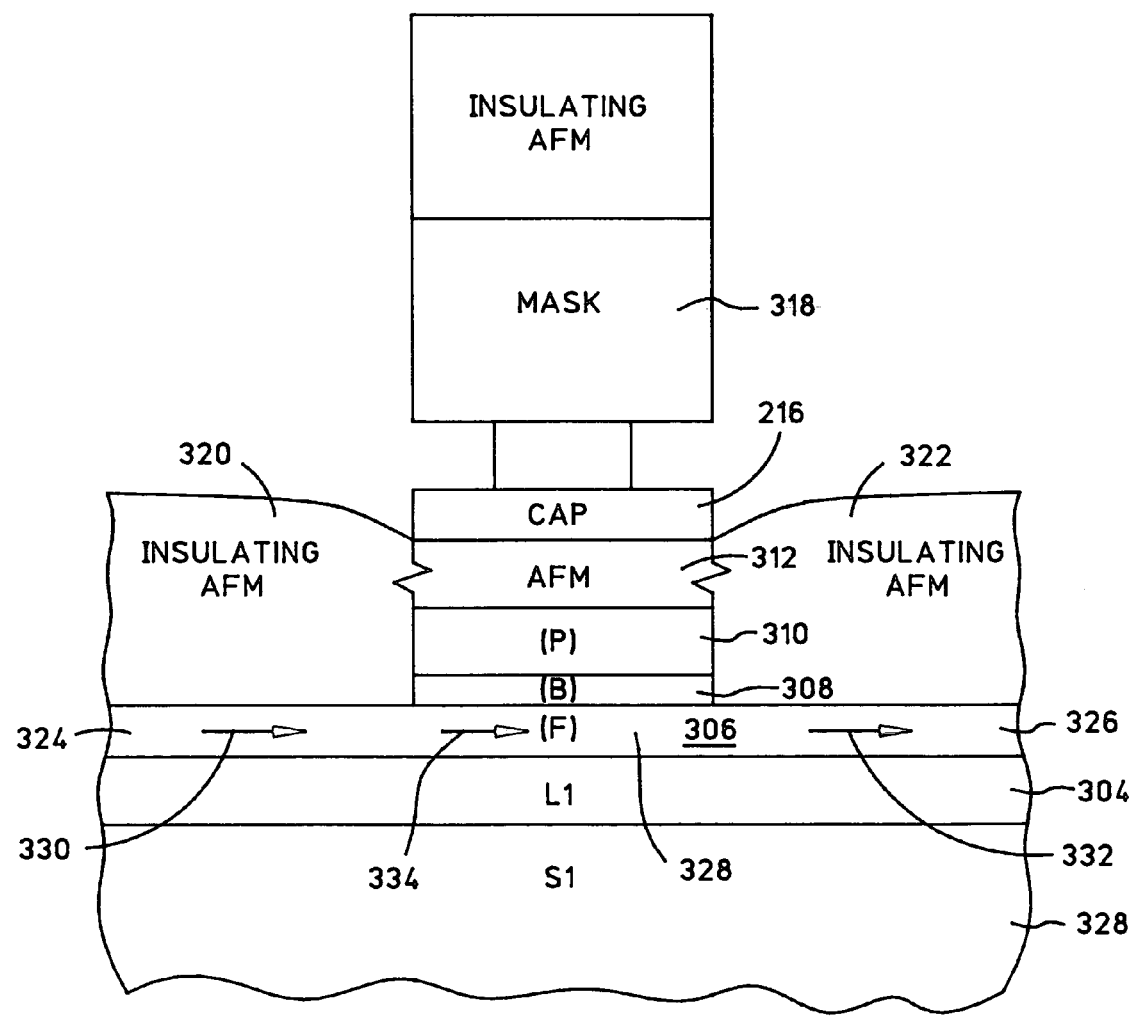
FIG. 15 is the same as FIG. 14 except ion milling has been implemented to remove exposed portions of the sensor material layers and then backfilled with an insulating antiferromagnetic (AFM) material.
Figure 16:
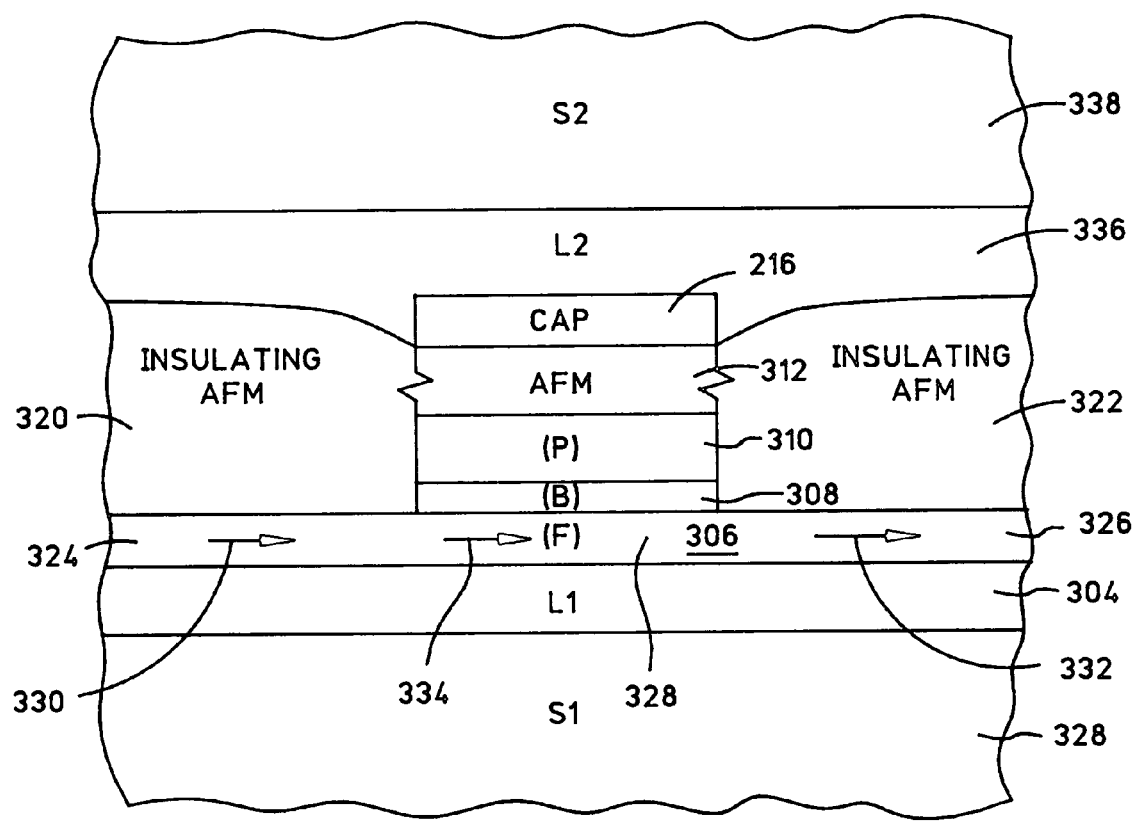
FIG. 16 is the same as FIG. 15 except the mask has been removed and the second lead layer and a second shield layer have been formed.

FIGS. 14–16 illustrate various steps in another method of the present invention for making another embodiment of the present read head, as shown in FIG. 16. As shown in FIG. 14, sensor material layers 300 are formed on a wafer (not shown) by any suitable means such as ion beam sputtering. A ferromagnetic first shield layer (S1) 302 is first formed on the wafer, a first lead layer (L1) 304 is formed on the first shield layer, a free layer (F) 306 is formed on the first lead layer, a tunneling barrier layer (B) 308 is formed on the free layer, a ferromagnetic pinned layer 310 is formed on the barrier layer, an antiferromagnetic (AFM) pinning layer 312 is formed on the pinned layer 310 and is exchange coupled thereto for pinning a magnetic moment 314 of the pinned layer perpendicular to the ABS and a nonmagnetic cap layer 316 is formed on the pinning layer. On top of the sensor material layers there is formed a bilayer photoresist mask 318 which has a width that defines a track width (TW) of the read head.

FIG. 15 is the same as FIG. 14 except ion milling has been implemented to remove portions of the sensor material layers exposed beyond the mask 318 down to the free layer 306 and then the milled portions have been backfilled with an insulating antiferromagnetic (AFM) material to form first and second insulating antiferromagnetic (AFM) layers 320 and 322. The first and second insulating AFM layers 320 and 322 interface and are exchange coupled to top surfaces of the first and second side portions 324 and 326 of the free layer which extend laterally beyond a central active portion 328 of the free layer beyond the track width of the read head. The magnetic spins of the first and second insulating AFM layers 320 and 322 are oriented so that magnetic moments 330 and 332 of the first and second side portions of the free layer are oriented from right to left or from left to right, as shown in FIG. 15, parallel to the ABS and parallel to the major thin film planes of the layers. This then causes a magnetic moment 334 of the central active portion of the free layer to be oriented in the same manner so as to uniformly longitudinally bias the central portion of the free layer to make it magnetically stable.

FIG. 16 is the same as FIG. 15 except a second lead layer (L2) 336 and a second shield layer (S2) 338, which may be the same as the second shield layer 82 in FIG. 6, are formed on top of the cap layer 216 and the first and second insulating AFM layers 320 and 322. The magnetic head shown in FIG. 16 may be employed as the magnetic head 72 in FIG. 6. The preferred material for the insulating AFM layers 320 and 322 is nickel oxide (NiO).

Discussion

Preferred materials are nickel iron (NiFe) for the free layers, cobalt iron (CoFe) for the pinned layers, alumina ($Al_2O_3$) for the barrier layers, tantalum (Ta) for the cap layers, copper (Cu) or gold (Au) for the lead layers and Sendust for the shield layers. It should be understood that the invention also includes a current perpendicular to the planes of the layers (CPP) type of sensor where a nonmagnetic electrically conductive spacer layer is substituted for the barrier layer. The preferred material for such a spacer layer is copper (Cu).

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

We claim:

1. A method of making a read head that has an air bearing surface (ABS) comprising the steps of:
    forming a ferromagnetic first shield layer;
    forming an antiferromagnetic pinning layer on the first shield layer;
    forming a ferromagnetic pinned layer on and exchange coupled to the pinning layer so that the pinning layer pins a magnetic moment of the pinned layer;
    forming a nonmagnetic spacer layer on the pinned layer;
    forming a first portion of a free layer on the spacer layer;
    forming a nonmagnetic cap layer on the first portion of the free layer;
    forming a mask on the cap layer with a width that defines a track width of the read head;
    milling away exposed portions of the cap layer, a portion of the free layer, spacer layer and pinned layer and backfilling with an electrically nonconductive antiferromagnetic material to form first and second antiferromagnetic (AFM) layers interfacing first and second side surfaces of remaining portions of the cap layer, a portion of the free layer, spacer layer and pinned layer;
    removing the mask;
    removing a remaining portion of the cap layer down to a remaining first portion of the free layer;
    forming a second portion of a free layer on the remaining first portion of the free layer and on each of the first and second AFM layers; and
    forming a ferromagnetic second shield layer on the second portion of the free layer.

2. A method of making a read head as claimed in claim 1 wherein the first and second AFM layers are formed of nickel oxide.

3. A method of making a magnetic head assembly comprising the steps of:
    making a read head including the steps of:
        forming a ferromagnetic first shield layer;
        forming an antiferromagnetic pinning layer on the first shield layer;
        forming a ferromagnetic pinned layer on and exchange coupled to the pinning layer so that the pinning layer pins a magnetic moment of the pinned layer;
        forming a nonmagnetic spacer layer on the pinned layer;
        forming a first portion of a free layer on the spacer layer;
        forming a nonmagnetic cap layer on the first portion of the free layer;
        forming a mask on the cap layer with a width that defines a track width of the read head;
        milling away exposed portions of the cap layer, a portion of the free layer, spacer layer and pinned layer and backfilling with an electrically nonconductive antiferromagnetic material to form first and second antiferromagnetic (AFM) layers interfacing first and second side surfaces of remaining portions of the cap layer, a portion of the free layer, spacer layer and pinned layer;
        removing the mask;
        removing a remaining portion of the cap layer down to a remaining first portion of the free layer;
        forming a second portion of a free layer on the remaining first portion of the free layer and on each of the first and second AFM layers; and
        forming a ferromagnetic second shield layer on the second portion of the free layer; making a write head including the steps of:
        forming ferromagnetic first and second pole piece layers that have a yoke portion between a pole tip portion and a back gap portion wherein the second pole piece layer comprises said second shield layer;
        forming a nonmagnetic write gap layer between the pole tip portions of the first and second pole piece layers;
        forming an insulation stack with at least one coil layer embedded therein between the yoke portions of the first and second pole piece layers; and
        connecting the first and second pole piece layers at their back gap portions.

* * * * *